(12) United States Patent
Wang et al.

(10) Patent No.: US 9,876,450 B2
(45) Date of Patent: Jan. 23, 2018

(54) ACTIVE CLAMP FOR MOTOR DRIVER

(71) Applicant: Marvell World Trade, Ltd., St. Michael (BB)

(72) Inventors: Yichao Wang, Singapore (SG); Ravishanker Krishnamoorthy, Singapore (SG); Kong Yin Leong, Singapore (SG)

(73) Assignee: Marvell World Trade, Ltd., St. Michael (BB)

( * ) Notice: Subject to any disclaimer, the term of this patent is extended or adjusted under 35 U.S.C. 154(b) by 383 days.

(21) Appl. No.: 14/604,589

(22) Filed: Jan. 23, 2015

(65) Prior Publication Data

US 2015/0214874 A1 Jul. 30, 2015

Related U.S. Application Data

(60) Provisional application No. 61/931,483, filed on Jan. 24, 2014.

(51) Int. Cl.
*H02H 9/00* (2006.01)
*H02P 6/14* (2016.01)
*H03K 5/08* (2006.01)
*H02P 6/08* (2016.01)

(52) U.S. Cl.
CPC .......... *H02P 6/14* (2013.01); *H02P 6/08* (2013.01); *H03K 5/08* (2013.01)

(58) Field of Classification Search
USPC ....................................... 361/56
See application file for complete search history.

(56) References Cited

U.S. PATENT DOCUMENTS

| | | | | |
|---|---|---|---|---|
| 5,572,096 A * | 11/1996 | Schlager | ................... | H02P 6/14 318/400.25 |
| 5,986,493 A * | 11/1999 | Li | ...................... | H03K 17/0822 327/312 |
| 6,166,500 A * | 12/2000 | Makaran | ................ | H02M 1/34 318/400.22 |
| 6,285,146 B1 * | 9/2001 | Harlan | ...................... | H02P 6/10 318/400.04 |
| 6,385,021 B1 * | 5/2002 | Takeda | ................ | H01L 27/0248 361/111 |

(Continued)

OTHER PUBLICATIONS

International Search Report and Written Opinion for PCT/IB2015/000064, filed Jan. 24, 2015.

*Primary Examiner* — Ronald W Leja

(57) ABSTRACT

An apparatus includes a clamp control circuit configured to control a first current to have a magnitude substantially equal to that of a second current when the second current has a first flow direction. The clamp control circuit is configured to control the first current to be substantially zero when the second current has a second flow direction. A method includes determining a value of a first current, controlling a second current to have a substantially zero value when the first current flows in a first direction, and controlling the second current to have a magnitude substantially equal to that of the first current when the first current flows in a second direction. The first current flows in the first direction when a winding of a motor is being supplied with energy and flows in the second direction when the winding of the motor is discharging energy.

20 Claims, 12 Drawing Sheets

(56) References Cited

U.S. PATENT DOCUMENTS

| | | | |
|---|---|---|---|
| 8,094,422 B2* | 1/2012 | Sasaki | H01L 23/60 361/56 |
| 2004/0109270 A1* | 6/2004 | Stockinger | H01L 27/0251 361/56 |
| 2005/0225272 A1* | 10/2005 | Wu | H02P 6/182 318/400.37 |
| 2010/0123419 A1 | 5/2010 | Bonvin | |
| 2011/0149444 A1* | 6/2011 | Koolen | H05B 33/089 361/18 |
| 2012/0176161 A1* | 7/2012 | Petruzzi | H01L 27/0251 327/63 |
| 2013/0038260 A1 | 2/2013 | Chang et al. | |
| 2014/0021893 A1* | 1/2014 | Komatsu | H02H 3/08 318/400.22 |
| 2015/0214874 A1* | 7/2015 | Wang | H02P 6/14 318/400.26 |
| 2016/0322966 A1* | 11/2016 | Akahane | H01L 21/822 |

* cited by examiner

ACTIVE CLAMP FOR MOTOR DRIVER

CROSS REFERENCE TO RELATED APPLICATION

This present disclosure claims the benefit of U.S. Provisional Application No. 61/931,483, filed on Jan. 24, 2014, which is incorporated by reference herein in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A Brush-Less Direct Current (BLDC) motor, also known as an electronically commutated synchronous motor, uses driver circuits to electronically commute one or more windings of the motor. The driver circuits periodically connect and disconnect the one or more windings of the motor to a supply voltage and a ground, and a current then flows through the one or more windings, generating one or more magnetic fields within the motor.

When the driver circuits disconnect the one or more windings from the supply voltage and the ground, the magnetic fields within the motor cause the current to continue flowing through the one or more windings. The continued flow of the current generates a voltage across the one or more windings. The voltage generated by the continued flow of the current rises until a path is found for the current to flow through.

In some driver circuits, the path includes one or more of protection diodes connected across conduction terminals of transistors of the driver circuits, body diodes intrinsic to the transistors of the driver circuit, and reactive components, such as capacitors, associated with a circuit that supplies power to the driver circuit.

The flow of the current dissipates energy stored in the magnetic fields in the motor. When the energy in the magnetic fields is completely dissipated, the current flow ceases.

SUMMARY

In an embodiment, an apparatus includes a clamp control circuit configured to control a first current to have a magnitude substantially equal to a magnitude of a second current when the second current has a predetermined flow direction.

In an embodiment, the predetermined flow direction is a first flow direction, and the clamp control circuit is configured to sense the second current and control the first current to be substantially zero when the second current has a second flow direction opposite the first flow direction.

In an embodiment, the apparatus includes a transistor configured to control the second current. The clamp control circuit is configured to provide a clamp signal to a control terminal of the transistor according to a value of the second current and a value of a reference voltage.

In an embodiment, the predetermined flow direction is a first flow direction. When the second current has the first flow direction, the transistor is controlled according to the clamp signal. When the second current has a second flow direction opposite the first flow direction, the transistor is controlled according to a signal other than the clamp signal.

In an embodiment, the apparatus includes a current sense resistor configured to generate a sense signal according to a value of the second current. The polarity of a value of the sense signal is a first polarity when the second current flows in the first direction. The polarity of the value of the sense signal is a second polarity opposite the first polarity when the second current flows in the second direction. The clamp control circuit includes a differential amplifier circuit configured to receive the sense signal and the reference voltage and generate the clamp signal according to a difference between the reference voltage and the sense signal.

In an embodiment, the apparatus includes a driver circuit having a first terminal coupled to a supply voltage and a second terminal coupled to a ground. The transistor has a first conduction terminal coupled to the first terminal of the driver circuit, and a second conduction terminal coupled to the second terminal of the driver circuit.

In an embodiment, the apparatus includes a blocking diode provided between the first terminal of the driver circuit and the supply voltage, a decoupling capacitor having a first terminal coupled to the first terminal of the driver circuit and a second terminal coupled to the ground, and a current sense resistor coupled between the second terminal of the driver circuit and the ground. The clamp control circuit determines the value of the second current according to a voltage drop across the current sense resistor.

In an embodiment, the driver circuit is a first driver circuit, and the apparatus includes a second driver circuit having a first terminal coupled to the supply voltage and a second terminal coupled to the ground.

In an embodiment, the apparatus includes a first driver circuit and a second driver circuit. When the second current has the predetermined flow direction and the second current flows through the first driver circuit, the clamp control circuit is configured to detect the flow of the second current in the first driver circuit and to control the second driver circuit so that the first current flows through the second driver circuit.

In an embodiment, when the second current has the predetermined flow direction and the second current flows through the second driver circuit, the clamp control circuit is configured to detect the flow of the second current in the second driver circuit and to control the first driver circuit so that the first current flows through the first driver circuit.

In an embodiment, the apparatus includes one or more sense circuits configured to detect that one or more diodes, respectively, are forward biased. The clamp control circuit is configured to control the first current when a sensed diode of the one or more diodes is forward biased, and is configured to not control the first current when none of the one or more diodes are forward biased.

In an embodiment, the apparatus includes a plurality of transistors and a switch circuit configured to determine a selected transistor of the plurality of transistor according to which of the one or more diodes is the sensed diode. The clamp control circuit is configured to control the first current by providing a clamp signal to the selected transistor.

In an embodiment, the sensed diode includes a protection diode coupled to a conduction terminal of a sensed transistor or includes a body diode of the sensed transistor.

In an embodiment, the sensed transistor is a transistor of the plurality of transistor other than the selected transistor.

In an embodiment, the clamp control circuit is provided in an integrated circuit.

In an embodiment, a method includes determining a value of a first current, controlling a second current to have a substantially zero value when the value of the first current indicates a first flow direction of the first current, and controlling the second current to have a magnitude substantially equal to a magnitude of the first current when the value of the first current indicates a second flow direction of the first current.

In an embodiment, the second flow direction is opposite the first flow direction.

In an embodiment, determining the value of the first current includes measuring a voltage drop across a resistor. The voltage drop across the resistor has a first polarity when the first current has the first flow direction, and has a second polarity opposite the first polarity when the first current has the second flow direction.

In an embodiment, controlling the second current to have the magnitude substantially equal to the magnitude of the first current includes generating a clamp signal according a difference between a reference voltage and the voltage drop, and supplying the clamp signal to a control terminal of a transistor when the value of the first current indicates the second flow direction of the first current. The transistor controls the magnitude of the second current.

In an embodiment, the clamp signal is not supplied to the control terminal of the transistor when the value of the first current indicates the first flow direction of the first current.

In an embodiment, the first current has the first flow direction when a winding of a motor is being supplied with energy and has the second flow direction when the winding of the motor is discharging energy.

In an embodiment, the method includes determining whether a diode is forward biased. When the diode is forward biased, the second current is controlled to have the magnitude substantially equal to the magnitude of the first current. When the diode is not forward biased, the second current is controlled to have the substantially zero value.

DETAILED DESCRIPTION

Figure 1:
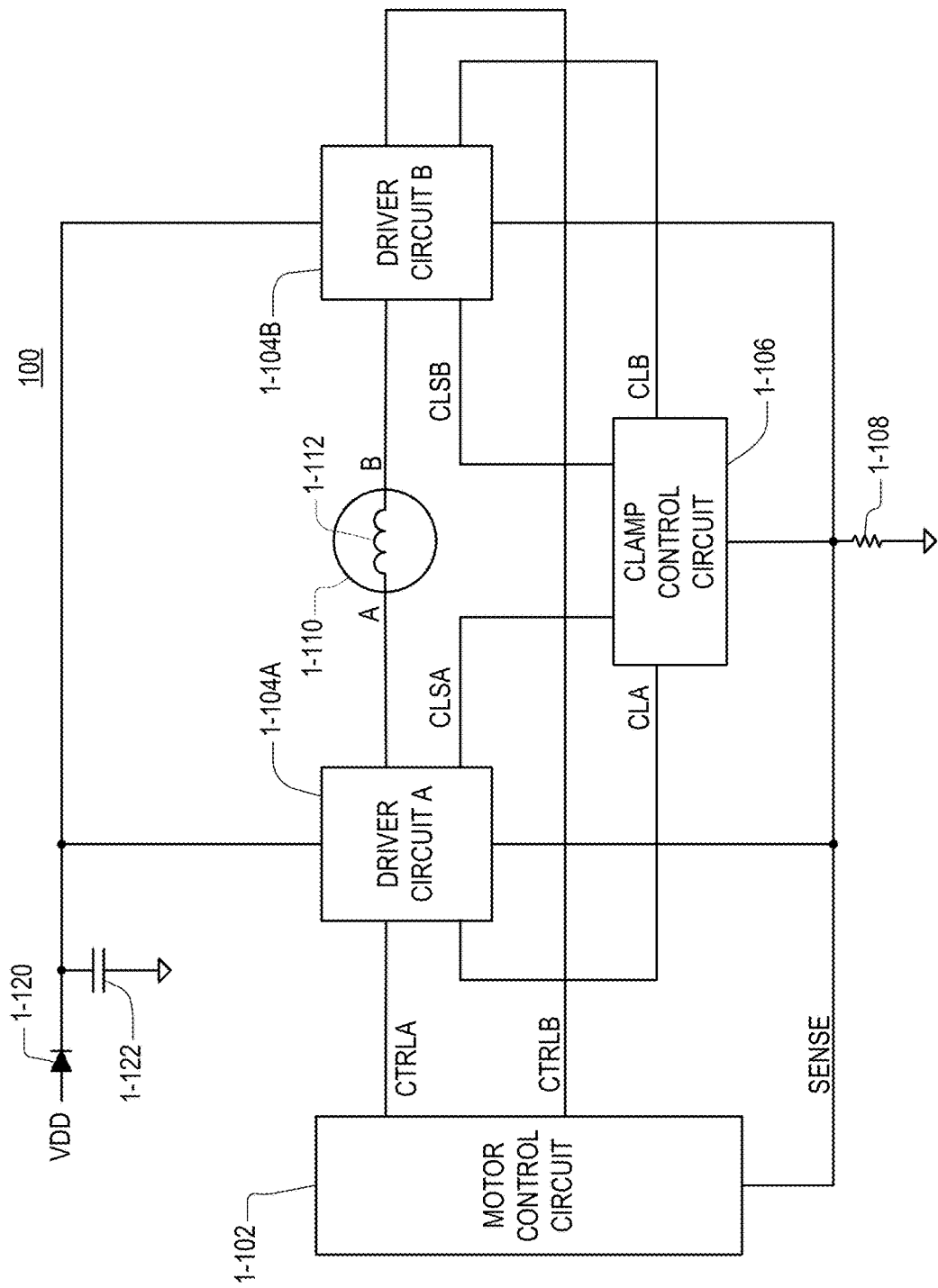
FIG. 1 illustrates a single-phase BLDC motor system according to an embodiment.

FIG. 1 illustrates a single phase Brush-Less Direct Current (BLDC) motor system 100 according to an embodiment. The BLDC motor system 100 includes a motor control circuit 1-102, first and second driver circuits 1-104A and 1-104B, a clamp control circuit 1-106, a current sense resistor 1-108, and a single-phase BLDC motor 1-110. A power supply voltage VDD is supplied to the first and second driver circuits 1-104A and 1-104B through a blocking diode 1-120 and a decoupling capacitor 1-122.

The motor control circuit 1-102 provides first and second control signals CTRLA and CTRLB to the first and second driver circuits 1-104A and 1-104B, respectively. In an embodiment, each of the first and second control signals CTRLA and CTRLB includes a plurality of signals. The motor control circuit 1-102 senses a current flow through one or more of the first and second driver circuits 1-104A and 1-104B by measuring a voltage across the current sense resistor 1-108.

The first and second driver circuits 1-104A and 1-104B are each connected to a supply voltage VDD through the blocking diode 1-120 and the decoupling capacitor 1-122. The blocking diode 1-120 is configured to prevent a backward flow of current from the first and second driver circuits 1-104A and 1-104B into a source of the supply voltage VDD. The decoupling capacitor 1-122 is configured to reduce the magnitude of voltage variations of the supply voltage VDD caused by variations of a current flowing through one or more of the first and second driver circuits 1-104A and 1-104B.

The first and second driver circuits 1-104A and 1-104B are each connected to a ground through the current sense resistor 1-108. The current sense resistor 1-108 is used to produce a current sense signal SENSE that is monitored by the motor control circuit 1-102 and by the clamp control circuit 1-106.

The first and second driver circuits 1-104A and 1-104B supply first and second motor drive signals to first and second motor terminals A and B of the motor 1-110, respectively. The motor 1-110 includes a winding 1-112 connected between the first and second motor terminals A and B. The motor 1-110 may further include a rotor (not shown) having one or more magnets, each magnet including a north pole and a south pole.

The first and second driver circuits 1-104A and 1-104B are at times used to supply energy to the winding 1-112 of the motor 1-110. A first portion of the energy supplied to the winding 1-112 is converted into mechanical energy and into heat, and a second portion of the energy supplied to the winding 1-112 is stored in the winding 1-112. When energy is not being supplied to the winding 1-112, the energy stored in the winding 1-112 may be discharged by a flow of a residue current from the winding 1-112.

The clamp control circuit 1-106 receives first and second clamp sense signals CLSA and CLSB from the first and second driver circuits 1-104A and 1-104B, respectively. The clamp control circuit also receives the current sense signal SENSE.

The clamp control circuit 1-106 generates first and second clamp signals CLA and CLB according to the first and second clamp sense signals CLSA and CLSB and the current sense signal SENSE. The clamp control circuit 1-106 is configured to generate the first and second clamp signals CLA and CLB according to a current flow generated by the discharge of the energy stored in the winding 1-112 of the motor 1-110 in order to divert some or all of the current flow generated by the discharge away from the decoupling capacitor 1-122. In an embodiment, the clamp control circuit 1-106 is configured to generate an active value of one or more of the first and second clamp sense signals CLSA and CLSB when the current sense signal SENSE has a voltage value less than a predetermined voltage value.

A person of skill in the art in light of the teachings and disclosures herein would understand that the BLDC motor system 100 may further include other circuits, such as back-EMF monitoring circuits and rotor position detection circuits. Such circuits are omitted in the interest of brevity. In an embodiment, all or part of the motor control circuit 1-102, the first and second driver circuits 1-104A and 1-104B, and the clamp control circuit 1-106 are provided in an integrated circuit.

Figure 2A:
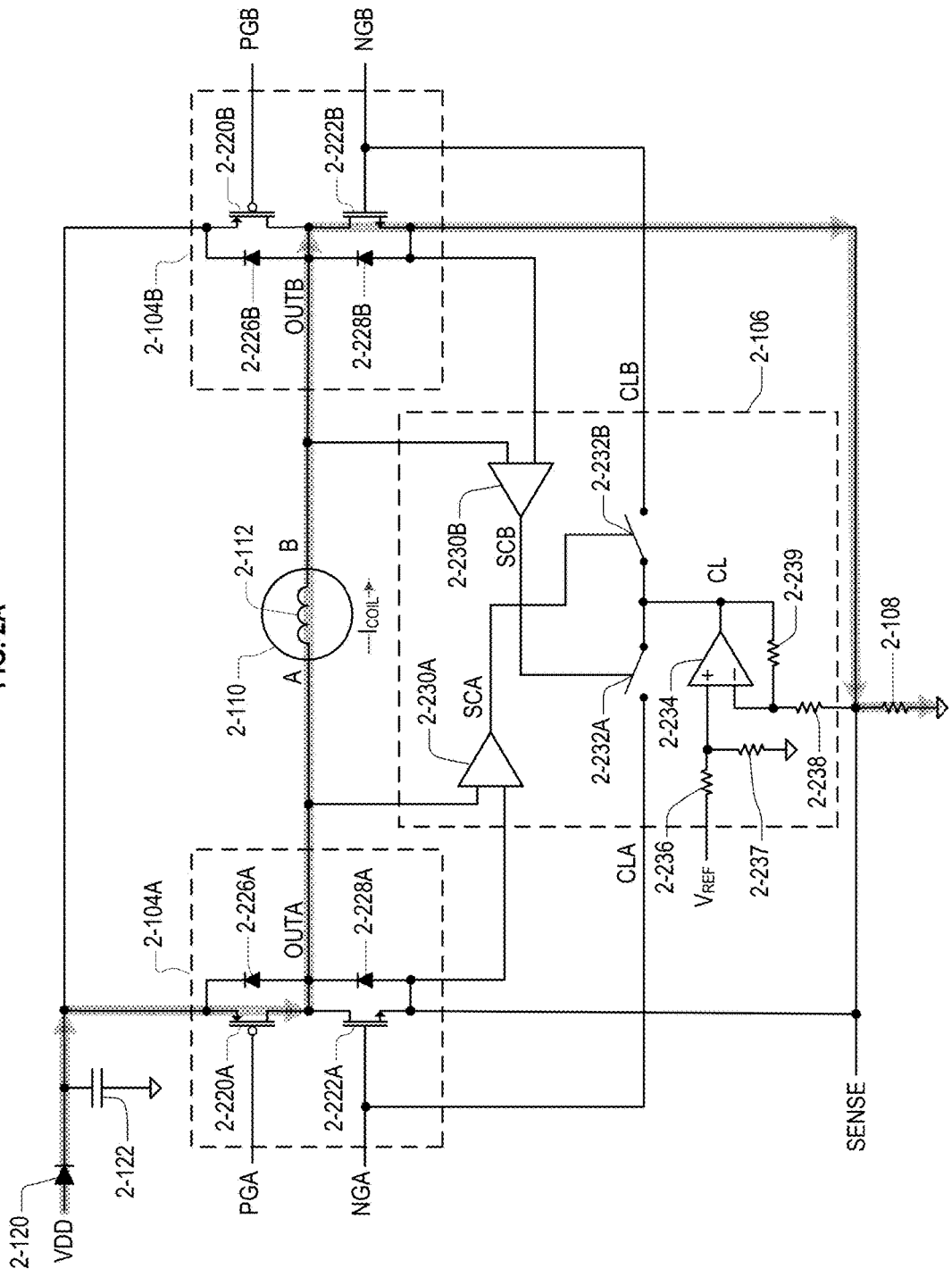
FIGS. 2A, 2B, and 2C illustrate additional features and operations of the single-phase BLDC motor system of FIG. 1 according to an embodiment.
Figure 2B:
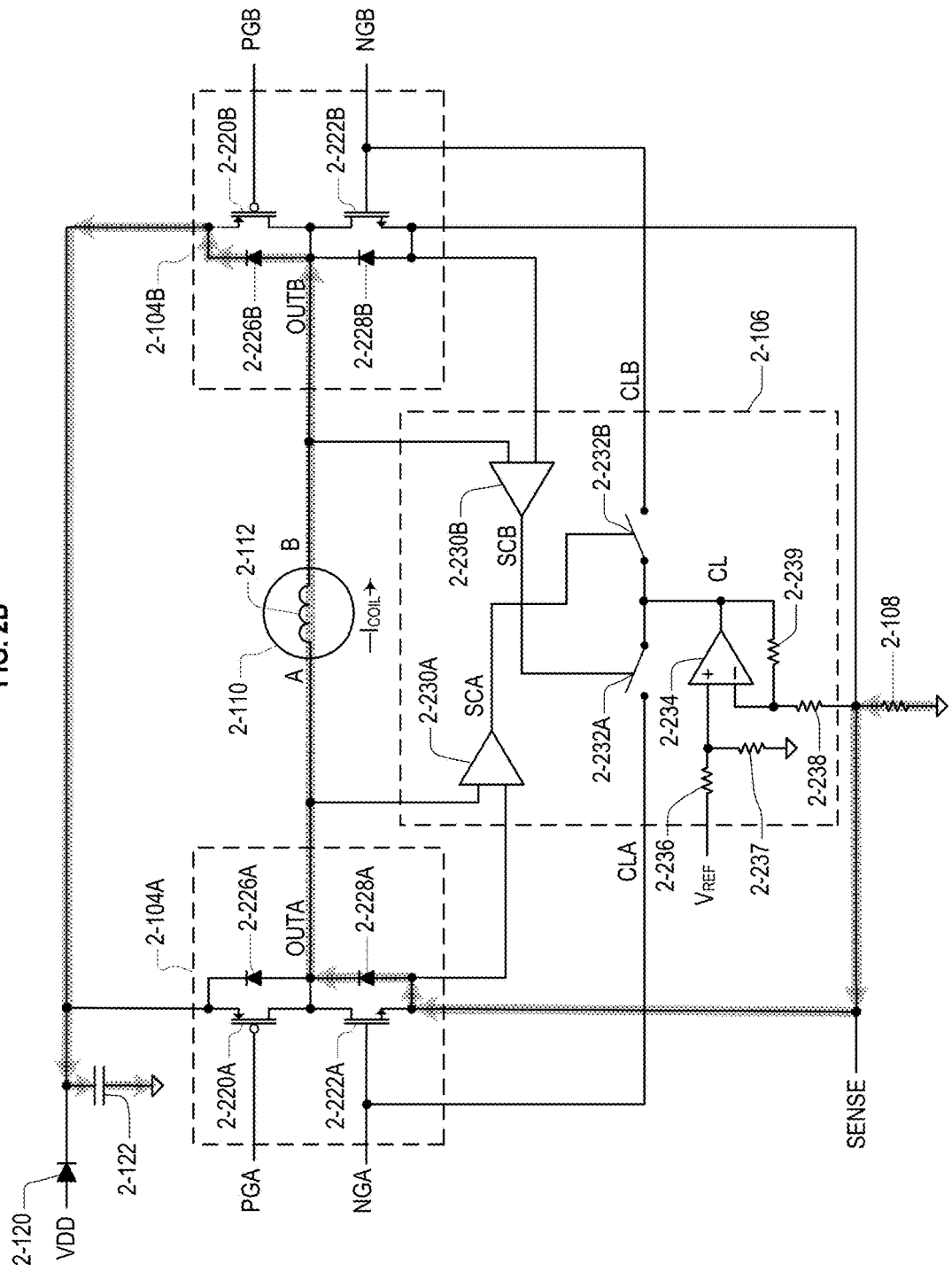
Figure 2C:
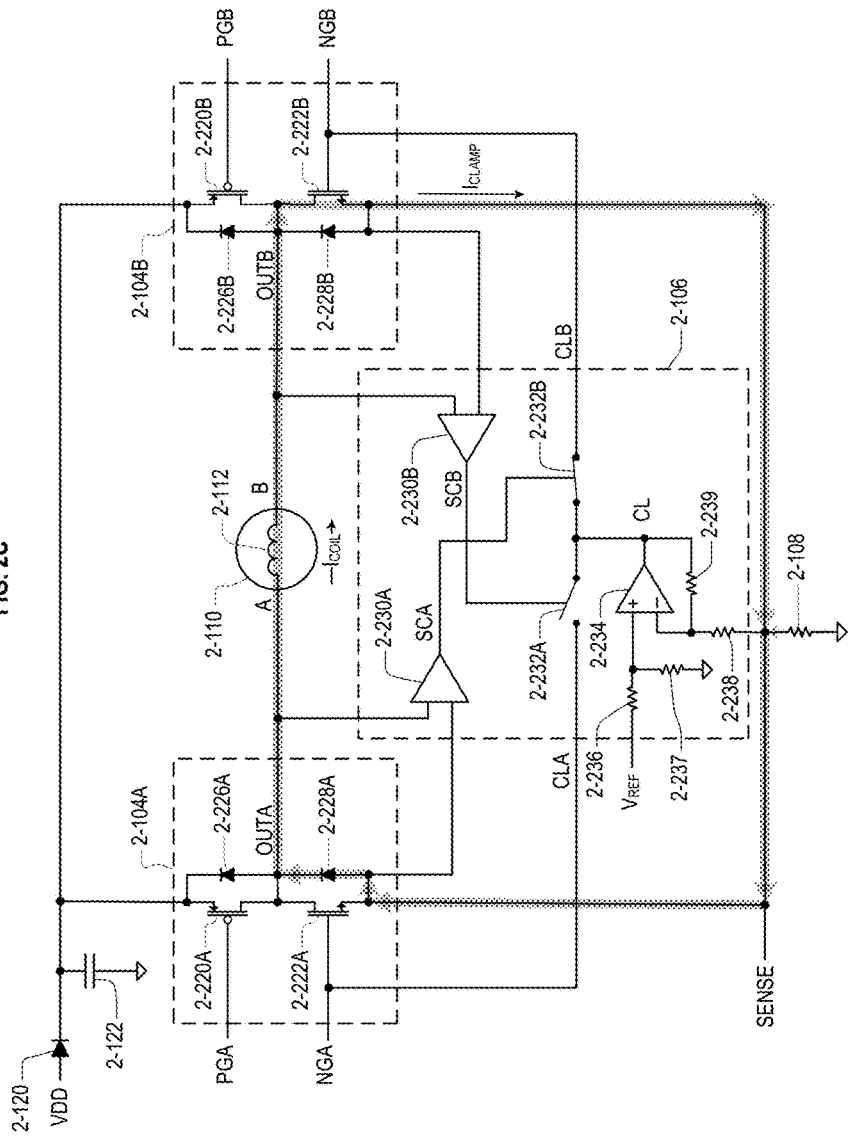

FIGS. 2A, 2B, and 2C illustrate further details and operations of first and second driver circuits 2-104A and 2-104B and a clamp control circuit 2-106, suitable for use as the first and second driver circuits 1-104A and 1-104B and the clamp control circuit 1-106, respectively, of the BLDC motor system 100 of FIG. 1 according to an embodiment. Gray arrows in FIGS. 2A, 2B, and 2C indicate current flows associated with the operations of the circuits 2-104A, 2-104B, and 2-106, as detailed below.

A supply voltage VDD having a positive voltage value is provided to an anode of a blocking diode 2-120. A cathode of the blocking diode 2-120 is connected to a first terminal of a decoupling capacitor 2-122. A second terminal of the decoupling capacitor 2-122 is connected to a ground.

The first driver circuit 2-104A receives a first positive gate signal PGA and a first negative gate signal NGA, and these signals may be included in the first control signals CTRLA of FIG. 1. The first driver circuit 2-104A includes a first p-channel Metal Oxide Semiconductor Field Effect Transistor (pMOSFET) 2-220A, a first n-channel Metal Oxide Semiconductor Field Effect Transistor (nMOSFET) 2-222A, a first upper protection diode 2-226A, and a first lower protection diode 2-228A. In an embodiment, the first upper protection diode 2-226A and the first lower protection diode 2-228A are body diodes intrinsic to the first pMOSFET 2-220A and the first nMOSFET 2-222A, respectively.

The first positive gate signal PGA is connected to a gate of the first pMOSFET 2-220A. A source of the first pMOSFET 2-220A is connected to the first terminal of the decoupling capacitor 2-122. A drain of the first pMOSFET 2-220A is connected to a first output terminal OUTA. The first upper protection diode 2-226A is connected between the drain and the source of the first pMOSFET 2-220A.

The first negative gate signal NGA is connected to a gate of the first nMOSFET 2-222A. A source of the first nMOSFET 2-222A is connected to the ground through a current sense resistor 2-108. A drain of the first nMOSFET 2-222A is connected to the first output terminal OUTA. The first lower protection diode 2-228A is connected between the drain and the source of the first nMOSFET 2-222A.

The second driver circuit 2-104B receives a second positive gate signal PGB and a second negative gate signal NGB, and these signals may be included in the second control signals CTRLB of FIG. 1. The second driver circuit 2-104B includes a second pMOSFET 2-220B, a second nMOSFET 2-222B, a second upper protection diode 2-226B, and a second lower protection diode 2-228B. In an embodiment, the second upper protection diode 2-226B and the second lower protection diode 2-228B are body diodes intrinsic to the second pMOSFET 2-220B and the second nMOSFET 2-222B, respectively.

The second positive gate signal PGB is connected to a gate of the second pMOSFET 2-220B. A source of the second pMOSFET 2-220B is connected to the first terminal of the decoupling capacitor 2-122. A drain of the second pMOSFET 2-220B is connected to a second output terminal OUTB. The second upper protection diode 2-226B is connected between the drain and the source of the second pMOSFET 2-220B.

The second negative gate signal NGB is connected to a gate of the second nMOSFET 2-222B. A source of the second nMOSFET 2-222B is connected to the ground through the current sense resistor 2-108. A drain of the second nMOSFET 2-222B is connected to the second output terminal OUTB. The second lower protection diode 2-228B is connected between the drain and the source of the second nMOSFET 2-222B.

The first output terminal OUTA of the first driver circuit 2-104A is connected to a first terminal A of a BLDC motor 2-110. The second output terminal OUTB of the second driver circuit 2-104B is connected to a second terminal B of the BLDC motor 2-110. A winding 2-112 is connected between the first and second terminals A and B of the BLDC motor 2-110.

The clamp control circuit 2-106 includes first and second voltage sense circuits 2-230A and 2-230B, first and second switches 2-232A and 2-232B, a differential amplifier circuit 2-234, and first, second, third, and fourth resistors 2-236, 2-237, 2-238, and 2-239. In an embodiment, the differential amplifier circuit 2-234 is an operational amplifier (opamp).

The first voltage sense circuit 2-230A receives first sense signals, which may be included in the first clamp sense signal CLSA of FIG. 1, from the first driver circuit 2-104A. The first sense signals correspond to a voltage across the first lower protection diode 2-228A. The first voltage sense circuit 2-230A uses the first sense signals to compare the voltage across the first lower protection diode 2-228A to a predetermined threshold voltage and generate a first switch control signal SCA according to the result of the comparison. The first switch control signal SCA is provided to the second switch 2-232B.

The second voltage sense circuit 2-230B receives second sense signals, which may be included in the second clamp sense signal CLSB of FIG. 1, from the second driver circuit 2-104B. The second sense signals correspond to a voltage across the second lower protection diode 2-228B. The second voltage sense circuit 2-230B uses the second sense signals to compare the voltage across the second lower protection diode 2-228B to a predetermined threshold voltage and generate a second switch control signal SCB according to the result of the comparison. The second switch control signal SCB is provided to the first switch 2-232A.

The differential amplifier circuit 2-234 includes positive and negative inputs. The positive input of the differential amplifier circuit 2-234 receives a scaled reference voltage $V_{SR}$ generated from a reference voltage $V_{REF}$ using a voltage divider that includes the first and second resistors 2-236 and 2-237. The first resistor 2-236 is connected between the reference voltage $V_{REF}$ and the positive input of the differential amplifier circuit 2-234. The second resistor 2-237 is connected between the positive input of the differential amplifier circuit 2-234 and the ground. The scaled reference voltage $V_{SR}$ is determined according to Equation 1, wherein $V_{REF}$ is a value of the reference voltage $V_{REF}$, $R_1$ is a resistance value of the first resistor 2-236, and $R_2$ is a resistance value of the second resistor 2-237:

$$V_{SR} = V_{REF} \cdot \frac{R_2}{R_1 + R_2}. \qquad \text{(Equation 1)}$$

The negative input of the differential amplifier circuit 2-234 receives the current sense signal SENSE through the third resistors 2-238. The fourth resistor 2-239 is connected between an output of and the negative input of the differential amplifier circuit 2-234. Accordingly, a voltage value $V_{CL}$ of a general clamp signal CL generated at the output of the differential amplifier circuit 2-234 is determined according to Equation 2, wherein $V_{SENSE}$ is a voltage value of the current sense signal SENSE, $R_3$ is a resistance value of the third resistor 2-238, and $R_4$ is a resistance value of the fourth resistor 2-239:

$$V_{CL} \approx V_{SR} + \frac{R_4}{R_3} \cdot (V_{SR} - V_{SENSE}). \qquad \text{(Equation 2)}$$

The general clamp signal CL is provided to the first and second switches 2-232A and 2-232B. When the first switch 2-232A is turned on by the second switch control signal SCB, the general clamp signal CL is provided to the gate of the first nMOSFET 2-222A as a first clamp signal CLA. When the second switch 2-232B is turned on by the first switch control signal SCA, the general clamp signal CL is provided to the gate of the second nMOSFET 2-222B as a second clamp signal CLB.

In an embodiment, the first negative gate signal NGA and the first clamp signal CLA are combined using a circuit including a resistor or other device (not shown) that maintains a voltage value of the gate of the first nMOSFET 2-222A at a low level during periods of time when neither the first negative gate signal NGA nor the first clamp signal CLA are provided to the gate of the first nMOSFET 2-222A. A similar circuit may be used to combine the second negative gate signal NGB and the second clamp signal CLB.

In another embodiment, the first and second switch control signals SCA and SCB may control first and second multiplexers that select either the first and second clamp signals CLA and CLB or the first and second negative gate signals NGA and NGB, respectively. A person of skill in the art in light of the teachings and disclosure herein would understand that a number of other circuits could be used to appropriately combine the first and second clamp signals CLA and CLB with the first and second negative gate signals NGA and NGB in order to control the first and second nMOSFETs 2-222A and 2-222B, respectively.

Figure 3:
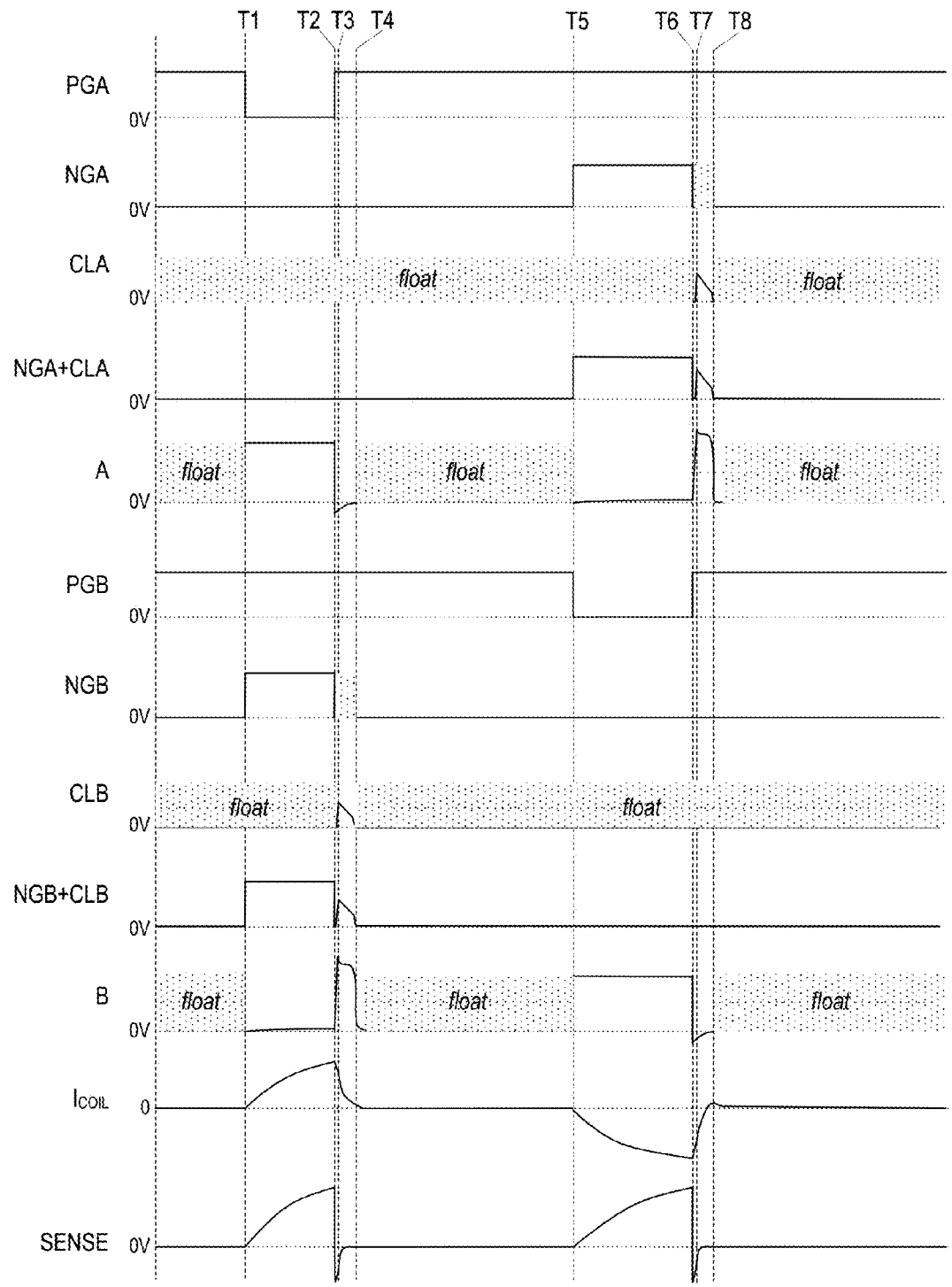
FIG. 3 is a waveform diagram illustrating operations of the single-phase BLDC motor system of FIGS. 1 and 2 according to an embodiment.

FIG. 3 is a waveform diagram illustrating operations of the circuits of FIGS. 2A, 2B, and 2C according to an embodiment. In particular, the gray arrows of FIG. 2A show currents flowing during a first interval between a first time T1 and a second time T2 shown in FIG. 3, the gray arrows of FIG. 2B show current flowing during a second interval between the second time T2 and a third time T3 shown in FIG. 3, and the gray arrows of FIG. 2C show current flowing during a third interval between the third time T3 and a fourth time T4 shown in FIG. 3

Initially, the first and second positive gate signals PGA and PGB have a high value, which turns off the first and second pMOSFETs 2-220A and 2-220B, respectively. The first and second negative gate signals NGA and NGB are driven low and the first and second clamp signals CLA and CLB are undriven, so that the respective first and second combinations of which, shown as first and second combined negative gate signals NGA+CLA and NGB+CLB in FIG. 3, have a low value which turns off the first and second nMOSFETs 2-222A and 2-222B, respectively. As a result, the first and second terminals A and B of the BLDC motor 2-110 float, no current flows throw the first and second driver circuits 2-104A and 2-104B, the current sense signal SENSE has a value of zero, and the coil current $I_{COIL}$ has a value of zero.

At the first time T1, as illustrated in FIG. 2A, the first positive gate signal PGA is driven low, which turns on the first pMOSFET 2-220A. The second negative gate NGB is driven high, which causes the second combined negative gate signals NGB+CLB to go high, which turns on the second nMOSFET 2-222B. As a result, the coil current $I_{COIL}$ flows from the supply voltage VDD through the blocking diode 2-120, the first pMOSFET 2-220A, the winding 2-112 of the BLDC motor 2-110, the second nMOSFET 2-222B, and the current sense resistor 2-108.

The first and second voltage sense circuits 2-230A and 2-230B respectively determine that the first and second lower protection diodes 2-228A and 2-228B are reverse biased, that is, that substantially no current is flowing through the first and second lower protection diodes 2-228A and 2-228B. Based on that determination, the first and second voltage sense circuit 2-230A and 2-230B generate first and second switch control signals SCA and SCB that turn off the second and first switches 2-232B and 2-232A, respectively.

At the second time T2, as illustrated in FIG. 2B, the first positive gate signal PGA is driven high, which turns off the first pMOSFET 2-220A. The second negative gate NGB is driven low and subsequently floated, which causes the second combined negative gate signals NGB+CLB to go low, which turns off the second nMOSFET 2-222B.

However, a coil current $I_{COIL}$ continues to flow through the winding 2-112 of the BLDC motor 2-110. As a result, a voltage value at the first terminal A of the BLDC motor 2-110 decreases to a negative value, and a voltage value at the second terminal B of the BLDC motor 2-110 increases to a value more positive than a voltage value of the power supply VDD.

The decrease in the voltage value at the first terminal A of the BLDC motor 2-110 causes the first lower protection diode 2-228A to become forward biased. The increase of the voltage value at the second terminal B of the BLDC motor 2-110 causes the second upper protection diode 2-226B to become forward biased.

As a result, the coil current $I_{COIL}$ flows from the ground, through the current sense resistor 2-108, the first lower protection diode 2-228A, the winding 2-112, and the second upper protection diode 2-226B. A direction of the current flow through the current sense resistor 2-108 is reversed in the time period following the second time T2 relative to a direction of the current flow through the current sense resistor 2-108 during the time period between the first time T1 and the second time T2. As a result, the voltage value $V_{SENSE}$ of the current sense signal SENSE, which was positive during the time period between the first time T1 and the second time T2, is negative during the time period following the second time T2.

The flow of the coil current $I_{COIL}$ is blocked by the blocking diode 2-120. Instead, the current flows through the decoupling capacitor 2-122, causing a voltage across the decoupling capacitor 2-122 to increase. If the voltage across the decoupling capacitor 2-122 increases to a value sufficiently higher than the voltage values of one or more of the first and second positive gate signals PGA and PBG, one or more of the first and second pMOSFETs 2-220A and 2-220B may be turned on at an inappropriate time. This turning on of the one or more of the first and second pMOSFETs 2-220A and 2-220B may cause unintended movement or braking of the BLDC motor 2-110 and increased power consumption.

At the third time T3, as illustrated in FIG. 2C, the clamp control circuit 2-106 operates to prevent the voltage across the decoupling capacitor 2-122 from becoming too high a value by diverting some or all of the coil current $I_{COIL}$ away from the decoupling capacitor 2-122. The delay from the second time T2 to the third time T3 is a response time of the clamp control circuit 2-106.

The first voltage sense circuit 2-230A determines that the first lower protection diode 2-228A is forward biased and drives the first switch control signal SCA with a value that turns the second switch 2-232B on. The first switch control signal SCA then provides the general clamp signal CL to the second nMOSFET 2-222B as the second clamp signal CLB.

In an embodiment, the first and second switches 2-232A and 2-232B may be controlled to provide, during the time period between the second time T2 and the fourth time T4, the general clamp signal CL to the one of the first and second nMOSFET 2-222A and 2-222B turned on during the time period between the first time T1 and the second time T2. The first and second switches 2-232A and 2-232B may be controlled during the time period between the second time T2 and the fourth time T4 according to the values of the first and second negative gate signals NGA and NGB during the time period between the first time T1 and the second time T2.

The current flowing from the ground through the current sense resistor 2-108 causes the current sense signal SENSE to have a negative voltage value. As a result, the second clamp signal CLB has a voltage value greater than the scaled reference voltage $V_{SR}$. The voltage value of the second clamp signal CLB causes the second nMOSFET 2-222B to turn on, and as a result a clamp current $I_{CLAMP}$ flows from the winding 2-112 through the second nMOSFET 2-222B and the first lower protection diode 2-228A, and then back to the winding 2-112.

Figure 4:
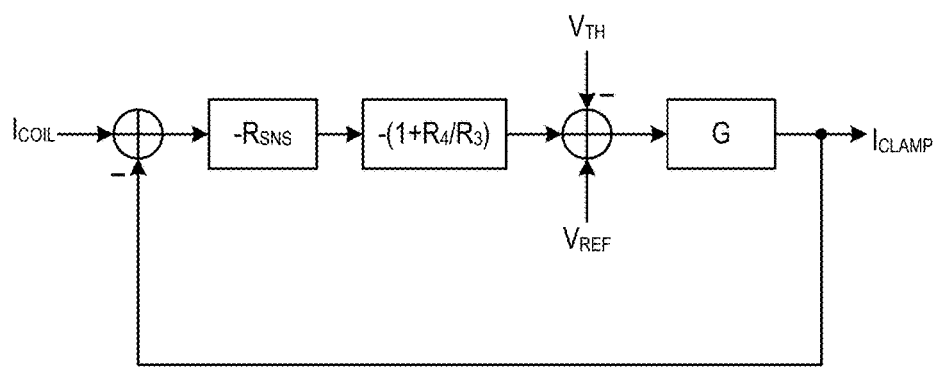
FIG. 4 is a control loop block diagram of the single-phase BLDC motor system of FIGS. 1 and 2 according to an embodiment.

FIG. 4 is a control loop block diagram illustrating the operation of the clamp control circuit 2-106 and the second nMOSFET 2-222B. In FIG. 4, $I_{COIL}$ is the magnitude of the coil current $I_{COIL}$ through the winding 2-112, $I_{CLAMP}$ is the magnitude of a clamp current $I_{CLAMP}$ through the second nMOSFET 2-222B, $R_{SNS}$ is a resistance value of the current sense resistor 2-108, $R_3$ is a resistance value of the third resistor 2-238, $R_4$ is a resistance value of the fourth resistor 2-239, $V_{TH}$ is a threshold voltage of the second nMOSFET 2-222B, $V_{REF}$ is a voltage value of the reference voltage $V_{REF}$, and G is a gain of the control loop. The gain G of the control loop may include a transconductance of the second nMOSFET 2-222B.

If the ratio of the resistance value $R_1$ of the first resistor 2-236 to the resistance value $R_2$ of the second resistor 2-237 is chosen to be equal to the ratio of the resistance value $R_4$ of the fourth resistor 2-239 to the resistance value $R_3$ of the third resistor 2-238, the magnitude of the clamp current $I_{CLAMP}$ is given by Equation 3, in which $K=1+R_4/R_3$:

$$I_{CLAMP} = \frac{K \cdot G \cdot R_{SNS} \cdot I_{COIL}}{1 + K \cdot G \cdot R_{SNS}} + \frac{(V_{REF} - V_{TH}) \cdot G}{1 + K \cdot G \cdot R_{SNS}}. \quad \text{(Equation 3)}$$

As can be seen from Equation 3, when the loop gain $K \cdot G \cdot R_{SNS}$ is large, the first term will be close to the coil current $I_{COIL}$. The second term is a voltage offset caused by the mismatch of the reference voltage $V_{REF}$ and the threshold voltage $V_{TH}$ of the second nMOSFET 2-222B, which voltage offset is attenuated by a factor of $K \cdot R_{SNS}$. By properly selecting the resistance value $R_3$ of the third resistor 2-238 and the resistance value $R_4$ of the fourth resistor 2-239, $K$ ($=1+R_4/R_3$) can be made large, and as a result the clamp current $I_{CLAMP}$ can be approximately equal to the coil current $I_{COIL}$. As a result, a very small amount of current flows to the decoupling capacitor 2-122, and an increase in the voltage across the decoupling capacitor 2-122 is reduced.

In an embodiment, the current sense resistor 2-108, the clamp control circuit 2-106, and the second nMOSFET 2-222B operate as a feedback loop configured to maintain a voltage at the second output terminal OUTB at a voltage value close to a voltage value of the power supply VDD, thus maintaining a fast current decay rate in the winding 2-112.

Returning to FIG. 3, at the fourth time T4, the energy stored in the winding 2-112 has dissipated, the coil current $I_{COIL}$ is substantially zero, and the first lower protection diode 2-228A is no longer forward biased. The first voltage sense circuit 2-230A determines that the first lower protection diode 2-228A is no longer forward biased and drives the first switch control signal SCA with a value that turns the second switch 2-232B off. As a result, after the time T4, the second nMOSFET 2-222B is no longer controlled by the clamp control circuit 2-106.

FIG. 3 also shows, during a time period from a fifth time T5 through a sixth time T7, a seventh time T7, and an eighth time T8, the operation of the BLDC motor control system 100 of FIGS. 1 and 2 when the coil current $I_{COIL}$ flows in a direction opposite the direction shown in FIGS. 2A, 2B, and 2C. A person of skill in the art would understand that during the periods between the fifth time T5 and the sixth time T6, the sixth time T6 and the seventh time T7, and the seventh time T7 and the eighth time T8, the BLDC motor control system 100 operates in a manner analogous to that described above for the periods between the first time T1 and the second time T2, the second time T2 and the third time T3, and the third time T3 and the fourth time T4, respectively.

During the time period between the fifth time T5 and the eighth time T8, the second pMOSFET 2-220B, the first nMOSFET 2-222A, the second lower protection diode 2-222B, the second voltage sense circuit 2-230B, and the first switch 2-232A perform the functions that were performed during the time period between the first time T1 and the fourth time T4 by the first pMOSFET 2-220A, the second nMOSFET 2-222B, the first lower protection diode 2-222A, the first voltage sense circuit 2-230A, and the second switch 2-232B, respectively. As a result, when the clamp control circuit turns the first nMOSFET 2-222A during the period between the seventh time T7 and the eighth time T8, the coil current $I_{COIL}$ flows through the winding 2-112 as indicated by the corresponding gray arrow in FIG. 2C but in the opposite direction.

Although the single-phase BLDC motor system 100 is described above, embodiments are not limited thereto, and a person of skill in the art in light of the teachings and disclosures herein would understand that the three-phase BLDC motor system 100 may be adapted for use with motors having two, three, or more than three phases, or with any motor having a coil driven using commutation. Furthermore, a person of skill in the art in light of the teachings and disclosures herein would understand that the single-phase BLDC motor system 100 may be adapted for use with a supply voltage VDD having a negative voltage value instead of a positive voltage value as described above.

Figure 5:
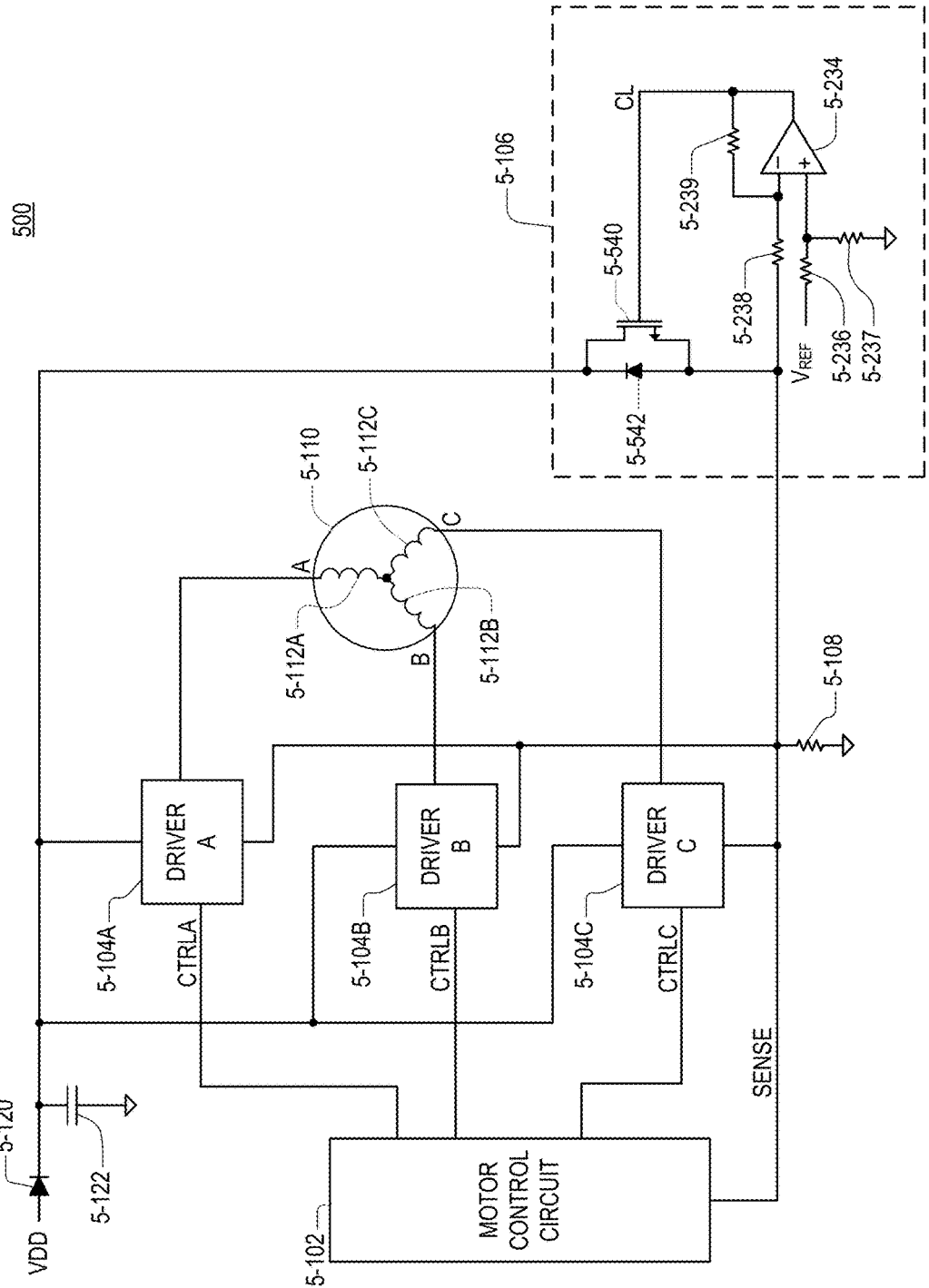
FIG. 5 illustrates a three-phase BLDC motor system according to an embodiment.

FIG. 5 illustrates a three-phase Brush-Less Direct Current (BLDC) motor system 500 according to an embodiment. The BLDC motor system 500 includes a motor control circuit 5-102, first, second, and third driver circuits 5-104A, 5-104B, and 5-104C, a clamp control circuit 5-106, a current sense resistor 5-108, a blocking diode 5-120, a decoupling capacitor 5-122, and a three-phase BLDC motor 5-110.

The motor control circuit 5-102 provides first, second, and third control signals CTRLA, CTRLB, and CTRLC to the first, second, and third driver circuits 5-104A, 5-104B, and 5-104C, respectively. In an embodiment, each of the first, second, and third control signals CTRLA, CTRLB, and CTRLC includes a plurality of signals. The motor control circuit 5-102 senses a current flow through one or more of the first, second, and third driver circuits 5-104A, 5-104B, and 5-104C by measuring a voltage across the current sense resistor 5-108.

The first, second, and third driver circuits 5-104A, 5-104B, and 5-104C are each connected to a supply voltage VDD through the blocking diode 5-120 and the decoupling capacitor 5-122. The blocking diode 5-120 is configured to prevent a backward flow of current from the first, second, and third driver circuits 5-104A, 5-104B, and 5-104C into a source of the supply voltage VDD. The decoupling capacitor 5-122 is configured to reduce the magnitude of voltage variations of the supply voltage VDD caused by variations of a current flowing through on or more of the first, second, and third driver circuits 5-104A, 5-104B, and 5-104C.

The first, second, and third driver circuits 5-104A, 5-104B, and 5-104C are each connected to a ground through the current sense resistor 5-108. The current sense resistor 5-108 is used to produce a current sense signal SENSE that is monitored by the motor control circuit 5-102 and by the clamp control circuit 5-106.

The first, second, and third driver circuits 5-104A, 5-104B, and 5-104C control first, second, and third signals supplied to first, second, and third motor terminals A, B, and C of the motor 5-110, respectively.

The motor 5-110 includes first, second, and third windings 5-112A, 5-112B, and 5-112C having first ends connected to the first, second, and third motor terminals A, B, and C, respectively. Second ends of the first, second, and third windings 5-112A, 5-112B, and 5-112C are connected to each other in a "wye" configuration. In another embodiment, the first, second, and third windings 5-112A, 5-112B, and 5-112C are connected to each other in a "delta" configuration wherein the second ends of the first, second, and third windings 5-112A, 5-112B, and 5-112C are connected to the first ends of the second, third, and first windings 5-112B, 5-112C, and 5-112A, respectively.

The first second, and third driver circuits 5-104A, 5-104B, and 5-104C are at times used to supply energy to one or more of the first, second, and third windings 5-112A, 5-112B, and 5-112C. A first portion of the energy supplied to the one or more of the first, second, and third windings 5-112A, 5-112B, and 5-112C is converted into mechanical energy and into heat. A second portion of the energy supplied to the one or more of the first, second, and third windings 5-112A, 5-112B, and 5-112C is stored in the first, second, and third windings 5-112A, 5-112B, and 5-112C. When energy is not being supplied to one or more of the first, second, and third windings 5-112A, 5-112B, and 5-112C, the energy stored in the first, second, and third windings 5-112A, 5-112B, and 5-112C may be discharged.

The clamp control circuit 5-106 includes a differential amplifier 5-234, first, second, third, and fourth resistors 5-236, 5-237, 5-238, and 5-239, a clamp nMOSFET 5-540, and a clamp protection diode 5-542. The clamp control circuit 5-106 is configured to reduce a backflow of current from one or more of the first, second, and third windings 5-112A, 5-112B, and 5-112C of the BLDC motor 5-110 to the decoupling capacitor 5-122, as described below. In an embodiment, the clamp protection diode 5-542 includes a body diode inherent in the clamp nMOSFET 5-540.

A person of skill in the art in light of the teachings and disclosures herein would understand that the BLDC motor system 500 may further include other circuits, such as back-EMF monitoring circuits and rotor position detection circuits. Such circuits are omitted in the interest of brevity. In an embodiment, all or part of the motor control circuit 5-102, the first, second, and third driver circuits 5-104A, 5-104B, and 1-104c, and the clamp control circuit 5-106 are provided in an integrated circuit.

Figure 6A:
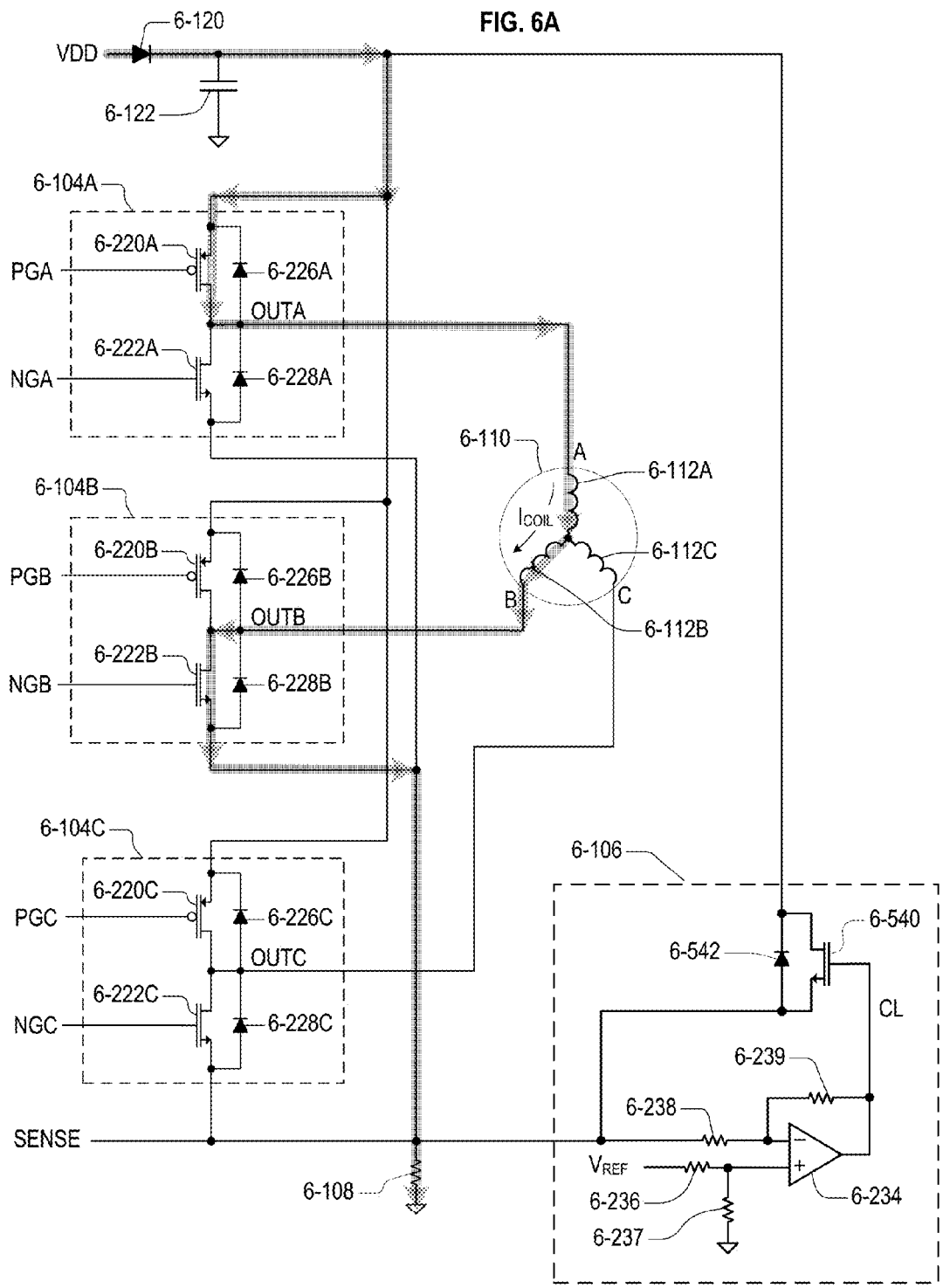
FIGS. 6A, 6B, and 6C illustrate additional features and operations of the three-phase BLDC motor system of FIG. 5 according to an embodiment.
Figure 6B:
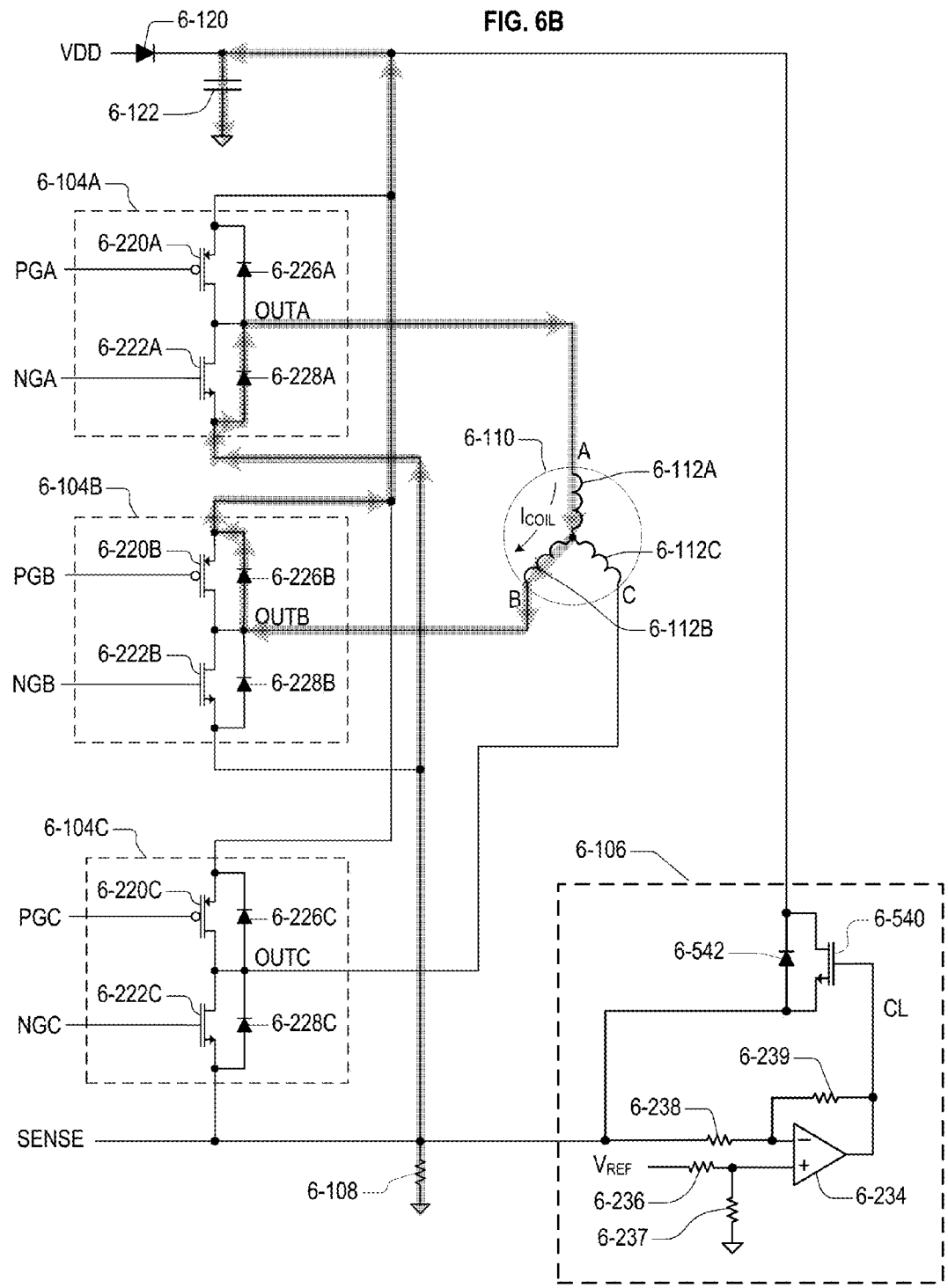
Figure 6C:
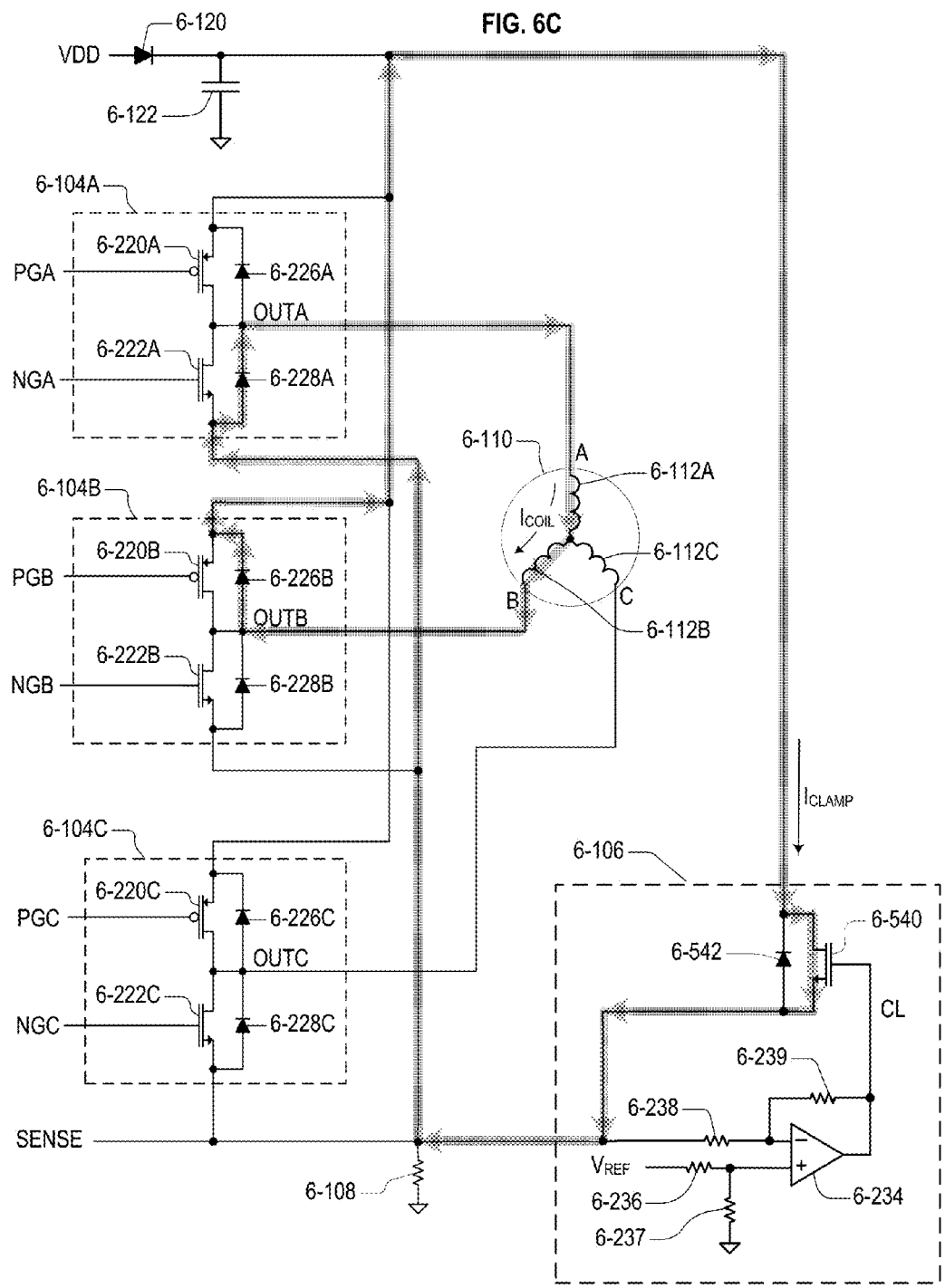

FIGS. 6A, 6B, and 6C illustrate further details and operations of first, second, and third driver circuits 6-104A, 6-104B, and 6-104C and a clamp control circuit 6-106, suitable for use as the first, second, and third driver circuits 5-104A, 5-104B, and 5-104C and the clamp control circuit 5-106, respectively, of the BLDC motor system 500 of FIG. 5 according to an embodiment. Gray arrows in FIGS. 6A, 6B, and 6C indicate current flows associated with the operations of the circuits 5-104A, 5-104B, 5-104C, and 5-106, as detailed below.

A supply voltage VDD is provided to an anode of a blocking diode 6-120. A cathode of the blocking diode 6-120 is connected to a first terminal of a decoupling capacitor 6-122. A second terminal of the decoupling capacitor 6-122 is connected to a ground.

The first driver circuit 6-104A receives a first positive gate signal PGA and a first negative gate signal NGA. These signals may be included in the first control signals CTRLA of FIG. 5.

The first positive gate signal PGA is connected to a gate of a first pMOSFET 6-220A. A source of the first pMOSFET 6-220A is connected to the first terminal of the decoupling capacitor 6-122. A drain of the first pMOSFET 6-220A is connected to a first output terminal OUTA. A first upper protection diode 6-226A is connected between the drain and the source of the first pMOSFET 6-220A. In an embodiment, the first upper protection diode 6-226A is a body diodes intrinsic to the first pMOSFET 6-220A.

The first negative gate signal NGA is connected to a gate of a first nMOSFET 6-222A. A source of the first nMOSFET 6-222A is connected to the ground through a current sense resistor 6-108. A drain of the first nMOSFET 6-222A is connected to the first output terminal OUTA. A first lower protection diode 6-228A is connected between the drain and the source of the first nMOSFET 6-222A. In an embodiment, the first lower protection diode 6-228A is a body diodes intrinsic to the first nMOSFET 6-222A.

When the first positive gate signal PGA signal has a high voltage value, the first pMOSFET 6-220A is turned off and no current flows through the first pMOSFET 6-220A. When the first positive gate signal PGA has a low voltage value, the first pMOSFET 6-220A is turned on and current may flow from the supply voltage VDD through the blocking diode 6-120 and the first pMOSFET 6-220A to the first output terminal OUTA.

When the first negative gate signal NGA signal has a low voltage value, the first nMOSFET 6-222A is turned off and no current flows through the first nMOSFET 6-222A. When the first negative gate signal NGA has a high voltage value, the first nMOSFET 6-222A is turned on and current may flow from the first output terminal OUTA through the first nMOSFET 6-222A and the current sense resistor 6-108 to the ground.

The second driver circuit 6-104B receives a second positive gate signal PGB and a second negative gate signal NGB. These signals may be included in the second control signals CTRLB of FIG. 5.

The second positive gate signal PGB is connected to a gate of a second pMOSFET 6-220B. A source of the second pMOSFET 6-220B is connected to the first terminal of the decoupling capacitor 6-122. A drain of the second pMOSFET 6-220B is connected to a second output terminal OUTB. A second upper protection diode 6-226B is connected between the drain and the source of the second pMOSFET 6-220B. In an embodiment, the second upper protection diode 6-226B is a body diode intrinsic to the second pMOSFET 6-220B.

The second negative gate signal NGB is connected to a gate of a second nMOSFET 6-222B. A source of the second nMOSFET 6-222B is connected to the ground through the current sense resistor 6-108. A drain of the second nMOSFET 6-222B is connected to the second output terminal OUTB. A second lower protection diode 6-228B is connected between the drain and the source of the second nMOSFET 6-222B. In an embodiment, the second lower protection diode 6-228B is a body diode intrinsic to the second nMOSFET 6-222B.

The third driver circuit 6-104C receives a third positive gate signal PGC and a third negative gate signal NGC. These signals may be included in the third control signals CTRLC of FIG. 5.

The third positive gate signal PGC is connected to a gate of a third pMOSFET 6-220C. A source of the third pMOSFET 6-220C is connected to the second terminal of the decoupling capacitor 6-122. A drain of the third pMOSFET 6-220C is connected to a third output terminal OUTC. A third upper protection diode 6-226C is connected between the drain and the source of the third pMOSFET 6-220C. In an embodiment, the third upper protection diode 6-226C is a body diode intrinsic to the third pMOSFET 6-220C.

The third negative gate signal NGC is connected to a gate of a third nMOSFET 6-222C. A source of the third nMOSFET 6-222C is connected to the ground through the current sense resistor 6-108. A drain of the third nMOSFET 6-222C is connected to the third output terminal OUTC. A third lower protection diode 6-228C is connected between the drain and the source of the third nMOSFET 6-222C. In an embodiment, the third lower protection diode 6-228C is a body diode intrinsic to the third nMOSFET 6-222C.

The second and third driver circuits 6-104B and 6-104C operate in a manner analogous to that described above for the first driver circuit 6-104A.

The BLDC motor 6-110 includes first, second, and third windings 6-112A, 6-112B, and 6-112C having first ends connected to the first, second, and third motor terminals A, B, and C, respectively. Second ends of the first, second, and third windings 6-112A, 6-112B, and 6-112C are connected to each other in a "wye" configuration. In another embodiment, the first, second, and third windings 6-112A, 6-112B, and 6-112C are connected to each other in a "delta" configuration wherein the second ends of the first, second, and third windings 6-112A, 6-112B, and 6-112C are connected to the first ends of the second, third, and first windings 6-112B, 6-112C, and 6-112A, respectively The clamp control circuit 6-106 includes a differential amplifier 6-234, first, second, third, and fourth resistors 6-236, 6-237, 6-238, and 6-239, a clamp nMOSFET 6-540, and a clamp protection diode 6-542.

The differential amplifier circuit 6-234 includes positive and negative inputs. The positive input of the differential amplifier circuit 6-234 receives a scaled reference voltage $V_{SR}$ generated from a reference voltage $V_{REF}$ using a voltage divider that includes the first and second resistors 6-236 and 6-237. The first resistor 6-236 is connected between the reference voltage $V_{REF}$ and the positive input of the differential amplifier circuit 6-234. The second resistor 6-237 is connected between the positive input of the differential amplifier circuit 6-234 and the ground. The scaled reference voltage $V_{SR}$ is determined according to Equation 1, above, wherein $R_1$ is a resistance value of the first resistor 6-236 and $R_2$ is a resistance value of the second resistor 6-237. In an embodiment, the reference voltage $V_{REF}$ is substantially equal to a threshold voltage $V_{TH}$ of the clamp nMOSFET 6-540.

The negative input of the differential amplifier circuit 6-234 receives the current sense signal SENSE through the third resistors 6-238. The fourth resistor 6-239 is connected between an output of and the negative input of the differential amplifier circuit 6-234. Accordingly, a voltage value of a clamp signal CL generated at the output of the differential amplifier circuit 6-234 is determined according to Equation 2, above, wherein $R_3$ is a resistance value of the third resistor 6-238 and $R_4$ is a resistance value of the fourth resistor 6-239.

The clamp signal CL is provided to a gate of the clamp nMOSFET 6-540. A drain of the clamp nMOSFET 6-540 is connected to the first terminal of the decoupling capacitor 6-122. A source of the clamp nMOSFET 6-540 is connected to the current sense resistor 6-108. A clamp protection diode 6-542 is connected to the drain and the source of the clamp nMOSFET 6-540. In an embodiment, the clamp protection diode 6-542 includes a body diode inherent to the clamp nMOSFET 6-540.

When a voltage value of the clamp signal CL exceeds a threshold voltage $V_{TH}$ of the clamp nMOSFET 6-540, current flows from the drain of the clamp nMOSFET 6-540 to the source of the clamp nMOSFET 6-540. When the voltage value of the clamp signal CL is below the threshold voltage $V_{TH}$ of the clamp nMOSFET 6-540, no current flows from the drain of the clamp nMOSFET 6-540 to the source of the clamp nMOSFET 6-540.

Figure 7:
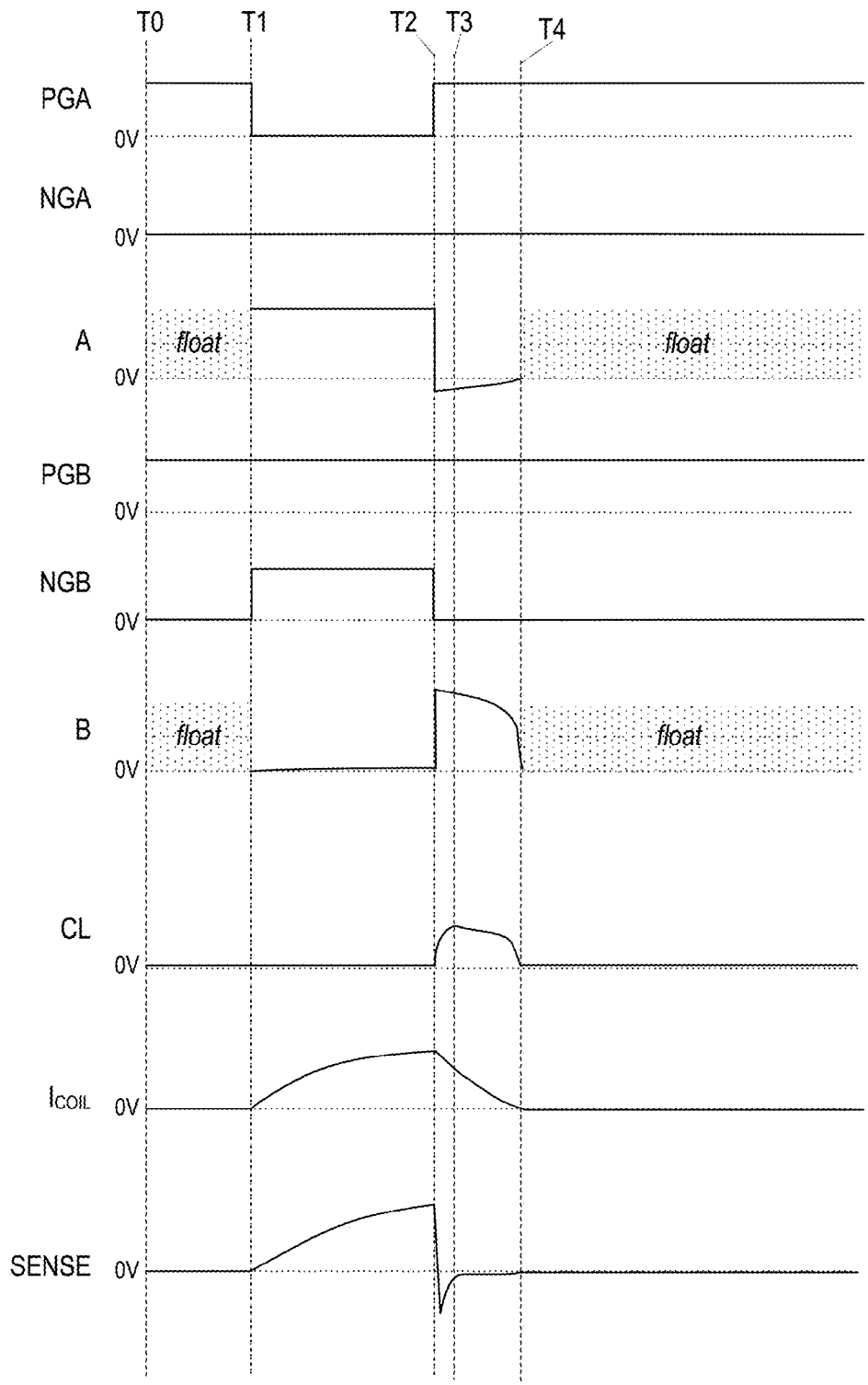
FIG. 7 is a waveform diagram illustrating operations of the three-phase BLDC motor system of FIGS. 5 and 6 according to an embodiment.

FIG. 7 is a waveform diagram illustrating operations of the circuits of FIGS. 6A, 6B, and 6C according to an embodiment. In particular, the gray arrows of FIG. 6A show currents flowing during a first interval between a first time T1 and a second time T2 shown in FIG. 7, the gray arrows of FIG. 6B show current flowing during a second interval between the second time T2 and a third time T3 shown in FIG. 7, and the gray arrows of FIG. 6C show current flowing during a third interval between the third time T3 and a fourth time T4 shown in FIG. 7

Initially, the first and second positive gate signals PGA and PGB have a high value, which turns off the first and second pMOSFETs 6-220A and 6-220B, respectively. The first and second negative gate signals NGA and NGB have a low value which turns off the first and second nMOSFETs 6-222A and 6-222B, respectively. As a result, the first and second terminals A and B of the BLDC motor 6-110 float, no current flows throw the first and second driver circuits 6-104A and 6-104B, the current sense signal SENSE has a value of zero, and the coil current $I_{COIL}$ has a value of zero.

The third positive gate signal PGC and the third negative gate signal NGC, not shown in FIG. 7, are maintained at a high level and a low level, respectively, through the time periods shown in FIG. 7. As a result, throughout the time periods shown in FIG. 7, the third pMOSFET 6-220C and the third nMOSFET 6-222C are turned off, and the third terminal C of the BLDC motor 6-110 floats.

Because the current sense signal SENSE has a value of zero, a voltage value of the clamp signal CL is less than a threshold voltage $V_{TH}$ of the clamp nMOSFET 6-540 and the clamp nMOSFET 6-540 is turned off.

At the first time T1, as illustrated in FIG. 6A, the first positive gate signal PGA is driven low, which turns on the first pMOSFET 6-220A. The second negative gate NGB is driven high, which turns on the second nMOSFET 6-222B. As a result, a current $I_{COIL}$ flows from the supply voltage VDD through the blocking diode 6-120, the first pMOSFET 6-220A, the first and second winding 6-112A and 6-112B of the BLDC motor 6-110, the second nMOSFET 6-222B, and the current sense resistor 6-108.

The flow of the coil current $I_{COIL}$ through the current sense resistor 6-108 causes the voltage value $V_{SENSE}$ of the current sense signal SENSE to have a positive voltage. As a result, the voltage value of the clamp signal CL is less than the threshold voltage $V_{TH}$ of the clamp nMOSFET 6-540 and the clamp nMOSFET 6-540 is turned off.

At the second time T2, as illustrated in FIG. 6B, the first positive gate signal PGA is driven high, which turns off the first pMOSFET 6-220A. The second negative gate NGB is driven low, which turns off the second nMOSFET 6-222B.

However, the coil current $I_{COIL}$ continues to flow through the first and second windings 6-112A and 6-112B of the BLDC motor 6-110. As a result, a voltage value at the first terminal A of the BLDC motor 6-110 decreases to a negative value, and a voltage value at the second terminal B of the BLDC motor 6-110 increases to a value more positive than a voltage value of the power supply VDD.

The decrease in the voltage value at the first terminal A of the BLDC motor 6-110 causes the first lower protection diode 6-228A to become forward biased. The increase of the voltage value at the second terminal B of the BLDC motor 6-110 causes the second upper protection diode 6-226B to become forward biased.

As a result, the coil current $I_{COIL}$ flows from the ground, through the current sense resistor 6-108, the first lower protection diode 6-228A, the first and second windings 6-112A and 6-112B, and the second upper protection diode 6-226B. A direction of the current flow through the current sense resistor 6-108 is reversed in the time period following the second time T2 relative to a direction of the current flow through the current sense resistor 6-108 during the time period between the first time T1 and the second time T2. As a result, the voltage value $V_{SENSE}$ of the current sense signal SENSE, which was positive during the time period between the first time T1 and the second time T2, is negative during the time period following the second time T2.

The flow of the coil current $I_{COIL}$ is blocked by the blocking diode 6-120. Instead, the coil current $I_{COIL}$ flows through the decoupling capacitor 6-122, causing a voltage across the decoupling capacitor 6-122 to increase.

If the voltage across the decoupling capacitor 6-122 increases to a value sufficiently higher than the voltage values of one or more of the first, second, and third positive gate signals PGA, PGB, and PGC, one or more of the first, second, and third pMOSFETs 6-220A, 6-220B, and 6-220C may be turned on at an inappropriate time. This turning on of the one or more of the first, second, and third pMOSFETs 6-220A, 6-220B, and 6-220C may cause unintended movement or braking of the BLDC motor 6-110 and increased power consumption.

At the third time T3, as illustrated in FIG. 6C, the clamp control circuit 6-106 operates to prevent the voltage across the decoupling capacitor 6-122 from increasing to too high a value by diverting some or all of the coil current $I_{COIL}$ away from the decoupling capacitor 6-122.

The coil current $I_{COIL}$ flowing from the ground through the current sense resistor 6-108 causes the current sense signal SENSE to have a negative voltage value. As a result, the clamp signal CL increases to a voltage value greater than the threshold voltage $V_{TH}$ of the clamp nMOSFET 6-540, and a clamp current $I_{CLAMP}$ flows through the clamp nMOSFET 6-540.

The operation of the clamp control circuit 6-106 and the clamp nMOSFET 6-540 is illustrated by the control loop block diagram of FIG. 4, in which $I_{COIL}$ is the magnitude of the coil current $I_{COIL}$, $I_{CLAMP}$ is the magnitude of a clamp current $I_{CLAMP}$ through the clamp nMOSFET 6-540, $R_{SNS}$ is a resistance value of the current sense resistor 6-108, $R_3$ is a resistance value of the third resistor 6-238, $R_4$ is a resistance value of the fourth resistor 6-239, $V_{TH}$ is a threshold voltage of the clamp nMOSFET 6-540, $V_{REF}$ is a voltage value of the reference voltage $V_{REF}$, and G is a gain of the control loop. The gain G of the control loop may include a transconductance of the clamp nMOSFET 6-540.

If the ratio of the resistance value $R_1$ of the first resistor 6-236 to the resistance value $R_2$ of the second resistor 6-237 is chosen to be equal to the ratio of the resistance value $R_4$ of the fourth resistor 6-239 to the resistance value $R_3$ of the third resistor 6-238, the magnitude of the clamp current $I_{CLAMP}$ is given by Equation 3, above, in which $K=1+R_4/R_3$.

As can be seen from Equation 3, when the loop gain $K \cdot G \cdot R_{SNS}$ is large, the first term will be close to the coil current $I_{COIL}$. The second term is a voltage offset caused by the mismatch of the reference voltage $V_{REF}$ and the threshold voltage $V_{TH}$ of the clamp nMOSFET 6-540, and the voltage offset is attenuated by a factor of $K \cdot R_{SNS}$. By properly selecting the resistance $R_3$ value of the third resistor 6-238 and the resistance value $R_4$ of the fourth resistor 6-239, K ($=1+R_4/R_3$) can be made large, and as a result the clamp current $I_{CLAMP}$ can be approximately equal to the coil current $I_{COIL}$. As a result, a very small amount of current flows to the decoupling capacitor 6-122, and an increase in the voltage across the decoupling capacitor 6-122 is reduced.

In the BLDC motor system 500, a voltage at the terminal of the BLDC motor 6-110 with the highest voltage, such as the second terminal B during the time period between the third time T3 and the fourth time T4 of FIG. 7, remains at a voltage value close to a voltage value of the power supply VDD when energy is being discharged from the windings of the BLDC motor 6-110, thus maintaining a fast current decay rate in the windings of the BLDC motor 6-110.

FIGS. 6A, 6B, 6C, and 7 illustrate the case where the coil current $I_{COIL}$ flows from the first terminal A of the BLDC motor 6-110 to the second terminal B of BLDC motor 6-110. A person of skill in the art in light of the teachings and disclosures herein would understand that the clamp circuit 6-106 would operate in a substantially identical manner when the current flow is from the second terminal B to the first terminal A, from the first terminal A to the third terminal C, from the third terminal C to the first terminal A, from the second terminal B to the third terminal C, or from the third terminal C to the second terminal B.

Although the three-phase BLDC motor system 500 is described above, embodiments are not limited thereto, and a person of skill in the art in light of the teachings and disclosures herein would understand that the three-phase BLDC motor system 500 may be adapted for use with motors having one, two, or more than three phases, or with any motor having a coil driven using commutation. Furthermore, a person of skill in the art in light of the teachings and disclosures herein would understand that the three-phase BLDC motor system 500 may be adapted for use with a supply voltage VDD having a negative voltage value instead of a positive voltage value as described above.

Although the embodiments described above include nMOSFETs and pMOSFETs, embodiments are not limited thereto. A person of skill in the art would understand that any of a variety of three-terminal electronic devices or circuits able to amplify and switch electrical signals could be used instead of the nMOSFET and pMOSFET described above, including Junction Field-Effect Transistors (JFETs), bipolar junction transistors (BJTs), and combinations thereof. A person of skill in the art would also understand that drains and sources of the nMOSEFTs and pMOSFETs of the described embodiments are conduction terminals of the nMOSFETs and pMOSFETs, and that other conduction terminals include, for example, collectors and emitters of BJTs. A person of skill in the art would also understand that the gates of the nMOSEFTs and pMOSFETs are control terminals of the nMOSFETs and pMOSFETs, and that other control terminals include the bases of BJTs.

Figure 8:
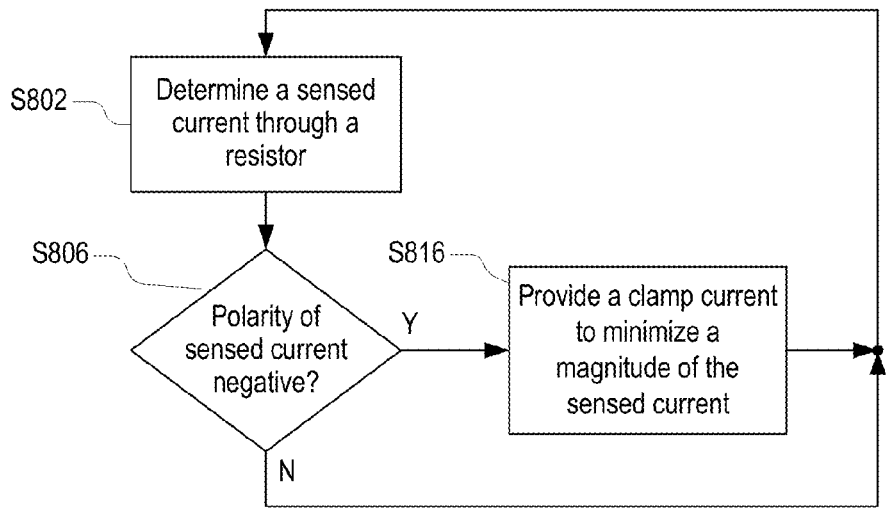
FIG. 8 is a flowchart of a process of controlling a clamp current according to an embodiment.

FIG. 8 is a flowchart of a process 800 of controlling a clamp current according to an embodiment.

At S802, a sensed current through a resistor is determined. In an embodiment, the resistor is a current sense resistor configured to sense a current flowing to or from a ground. In an embodiment, the sensed current is determined according to a voltage drop across the resistor.

At S806, a polarity of the sensed current is determined. In an embodiment, the polarity of the sensed current is positive when the sensed current is flowing into the ground, and is negative when the sensed current is flowing from the ground.

If the polarity is negative, at S816 a clamp current is generated. A magnitude of the clamp current is controlled so as to minimize the current flow through the resistor. In an embodiment, when the polarity is negative, the magnitude of the clamp current is controlled by a feedback loop circuit including the resistor.

Figure 9:
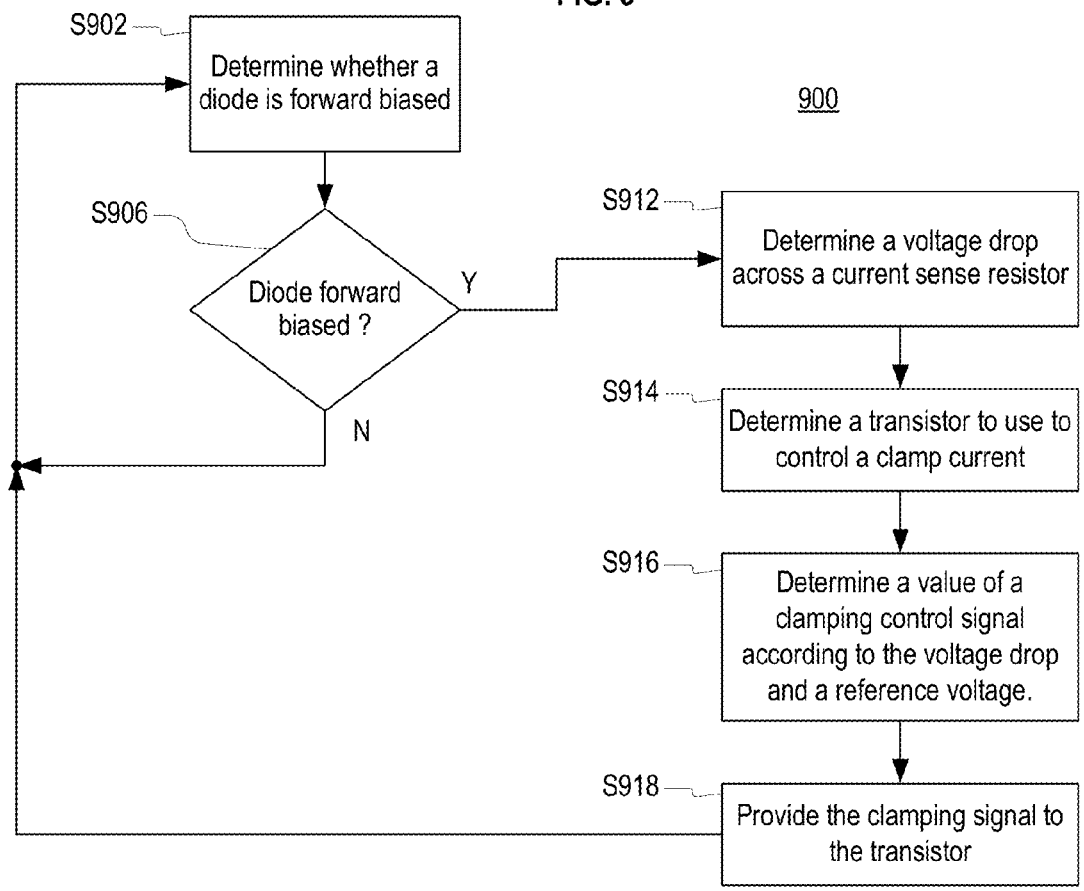
FIG. 9 is a flowchart of a process of controlling a clamp current according to another embodiment.

FIG. 9 is a flowchart of a process 900 of controlling a clamp current according to another embodiment.

At S902, one or more diodes are monitored to determine whether any of the one or more diodes is forward biased, that is, whether any of the one or more diodes is conducting current. In an embodiment, the one or more diodes are each protection diodes or body diodes associated with transistors of one or more driver circuits. The one or more driver circuits may be configured to provide energy to one or more windings of a motor.

At S906, when a diode of the one or more diodes is forward biased, the process 900 enters or continues to be in a clamp mode by proceeding to S912. When none of the one or more diodes are forward biased, the process 900 exits or does not enter the clamp mode.

At S912, a voltage drop across a current sense resistor is determined. The current sense resistor is configured to measure a current flowing to or from a ground of a motor control circuit. In an embodiment, the voltage drop across the current sense resistor is a positive voltage when the current is flowing to the ground, and is a negative voltage when the current is flowing from the ground.

At S914, a transistor for controlling the clamp current is selected from one or more transistors. The one or more transistors may include transistors of the one or more driver circuits. In an embodiment, the transistor is selected according to which of the one or more diodes is forward biased. The transistor may be a transistor of a first driver circuit of the one or more driver circuits, and the diode may be a protection diode or a body diode of a second driver circuit of the one or more driver circuits.

In another embodiment, the transistor is selected according to a previous state of control signals provided to the one or more driver circuits. The control signals may include control signals that turn respective transistors of the plurality of transistors on when the drive circuits are providing energy to the one or more windings of the motor. The selected transistor may be a transistor selected by the control signals to conduct current during a previous time period.

At S916, a value of a clamp signal is determined according to a difference between a reference voltage and the voltage drop. In an embodiment, the reference voltage corresponds to a threshold voltage of the transistor.

At S918, the clamp signal is provided to the transistor, and the transistor operates to control the clamp current. A feedback loop circuit including the transistor and the current sense resistor operate to minimize the magnitude of the negative voltage drop across the current sense resistor. The feedback loop may have a high gain and may operate to minimize the flow of current from the ground through the current sense resistor.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. An apparatus comprising:
    a clamp control circuit configured to control a first current to have a magnitude substantially equal to a magnitude of a second current when the second current has a first flow direction;
    a power supply device configured to supply the second current in a second flow direction, the second flow direction being opposite the first flow direction; and
    one or more sense circuits configured to detect that one or more diodes, respectively, are forward biased,
    wherein the clamp control circuit is configured to control the first current when a sensed diode of the one or more diodes is forward biased.

2. The apparatus of claim 1,
    wherein the clamp control circuit is configured to control the first current to be substantially zero when the second current has the second flow direction opposite the first flow direction.

3. The apparatus of claim 1, further comprising a transistor configured to control the second current,
    wherein the clamp control circuit is configured to provide a clamp signal to a control terminal of the transistor according to a value of the second current and a value of a reference voltage.

4. The apparatus of claim 3,
wherein when the second current has the first flow direction, the transistor is controlled according to the clamp signal, and
wherein when the second current has the second flow direction opposite the first flow direction, the transistor is controlled according to a signal other than the clamp signal.

5. The apparatus of claim 4, further comprising a current sense resistor configured to generate a sense signal according to the value of the second current,
wherein the polarity of a value of the sense signal is a first polarity when the second current flows in the first direction,
wherein the polarity of the value of the sense signal is a second polarity opposite the first polarity when the second current flows in the second direction, and
wherein the clamp control circuit includes a differential amplifier circuit configured to receive the sense signal and the reference voltage and generate the clamp signal according to a difference between the reference voltage and the sense signal.

6. The apparatus of claim 3, further comprising:
a driver circuit having a first terminal coupled to a supply voltage of the power supply device and a second terminal coupled to a ground,
wherein the transistor has a first conduction terminal coupled to the first terminal of the driver circuit, and a second conduction terminal coupled to the second terminal of the driver circuit.

7. The apparatus of claim 6, further comprising:
a blocking diode provided between the first terminal of the driver circuit and the supply voltage;
a decoupling capacitor having a first terminal coupled to the first terminal of the driver circuit and a second terminal coupled to the ground; and
a current sense resistor coupled between the second terminal of the driver circuit and the ground,
wherein the clamp control circuit determines the value of the second current according to a voltage drop across the current sense resistor.

8. The apparatus of claim 6, wherein the driver circuit is a first driver circuit, the apparatus further comprising:
a second driver circuit having a first terminal coupled to the supply voltage and a second terminal coupled to the ground.

9. The apparatus of claim 1,
wherein the clamp control circuit is configured to not control the first current when none of the one or more diodes are forward biased.

10. The apparatus of claim 9, further comprising:
a plurality of transistors; and
a switch circuit configured to determine a selected transistor of the plurality of transistor according to which of the one or more diodes is the sensed diode,
wherein the clamp control circuit is configured to control the first current by providing a clamp signal to the selected transistor.

11. The apparatus of claim 10, wherein the sensed diode includes a protection diode coupled to a conduction terminal of a sensed transistor or includes a body diode of the sensed transistor.

12. The apparatus of claim 11, wherein the sensed transistor is a transistor of the plurality of transistor other than the selected transistor.

13. The apparatus of claim 1, wherein the clamp control circuit is provided in an integrated circuit.

14. An apparatus comprising:
a clamp control circuit configured to control a first current to have a magnitude substantially equal to a magnitude of a second current when the second current has a predetermined flow direction, the predetermined flow direction being toward a power supply having a positive voltage value;
a first driver circuit; and
a second driver circuit,
wherein when the second current has the predetermined flow direction and the second current flows through the first driver circuit, the clamp control circuit is configured to detect the flow of the second current in the first driver circuit and to control the second driver circuit so that the first current flows through the second driver circuit.

15. The apparatus of claim 14, wherein when the second current has the predetermined flow direction and the second current flows through the second driver circuit, the clamp control circuit is configured to detect the flow of the second current in the second driver circuit and to control the first driver circuit so that the first current flows through the first driver circuit.

16. A method comprising:
determining a value of a first current;
controlling a second current to have a substantially zero value when the value of the first current indicates a first flow direction of the first current; and
controlling the second current to have a magnitude substantially equal to a magnitude of the first current when the value of the first current indicates a second flow direction of the first current, the second flow direction being opposite the first flow direction,
wherein determining the value of the first current includes measuring a voltage drop across a resistor, and
wherein the voltage drop across the resistor has a first polarity when the first current has the first flow direction, and has a second polarity opposite the first polarity when the first current has the second flow direction.

17. The method of claim 16, wherein controlling the second current to have the magnitude substantially equal to the magnitude of the first current includes:
generating a clamp signal according a difference between a reference voltage and the voltage drop; and
supplying the clamp signal to a control terminal of a transistor when the value of the first current indicates the second flow direction of the first current,
wherein the transistor controls the magnitude of the second current.

18. The method of claim 17, wherein the clamp signal is not supplied to the control terminal of the transistor when the value of the first current indicates the first flow direction of the first current.

19. The method of claim 17, wherein the first current has the first flow direction when a winding of a motor is being supplied with energy, and
wherein the first current has the second flow direction when the winding of the motor is discharging energy.

20. The method of claim 16, further comprising:
determining whether a diode is forward biased;
when the diode is forward biased, controlling the second current to have the magnitude substantially equal to the magnitude of the first current; and
when the diode is not forward biased, controlling the second current to have the substantially zero value.

* * * * *